United States Patent [19]

O'Mara et al.

[11] Patent Number: 5,677,688
[45] Date of Patent: Oct. 14, 1997

[54] OPTOMECHANICAL INFORMATION ENTRY DEVICE

[75] Inventors: Kerry Dennis O'Mara, Florence; Robert Richard Demers, Cranbury; William John Bachman, Mt. Laurel; Paul Joseph Smalser, Sr., Hamilton Square, all of N.J.

[73] Assignee: David Sarnoff Research Center, Inc., Princeton, N.J.

[21] Appl. No.: 882,432

[22] Filed: May 13, 1992

[30] Foreign Application Priority Data

Sep. 6, 1991 [GB] United Kingdom ............ 9119092

[51] Int. Cl.⁶ .................................................. H03K 17/94
[52] U.S. Cl. ...................................... 341/31; 250/227.22
[58] Field of Search ................. 341/31, 26; 250/227.22, 250/229, 222.1; 400/477, 479; 345/168

[56] References Cited

U.S. PATENT DOCUMENTS

| | | | |
|---|---|---|---|
| Re. 33,422 | 11/1990 | Garcia | 250/229 |
| 3,796,880 | 3/1974 | Dorey | 250/227.22 |
| 3,937,952 | 2/1976 | Ripley et al. | 250/227.22 |
| 4,417,824 | 11/1983 | Paterson | 400/477 |
| 4,480,182 | 10/1984 | Ely et al. | 250/227.22 |
| 4,480,183 | 10/1984 | Ely et al. | 250/227.22 |
| 4,480,184 | 10/1984 | Ely | 250/227.22 |
| 4,716,287 | 12/1987 | Nestler | 250/227.13 |
| 4,731,530 | 3/1988 | Mikan | 250/229 |
| 4,807,166 | 2/1989 | Zalenski | 364/571.06 |
| 4,860,008 | 8/1989 | Battarel | 341/31 |
| 4,884,073 | 11/1989 | Souloumiac | 341/31 |
| 4,906,843 | 3/1990 | Jones et al. | 250/221 |
| 4,922,236 | 5/1990 | Heady | 340/710 |
| 5,036,191 | 7/1991 | Senod | 341/31 X |
| 5,049,863 | 9/1991 | Oka | 340/710 |

FOREIGN PATENT DOCUMENTS

| | | | |
|---|---|---|---|
| 2536185 | 5/1984 | France | 341/31 |
| 2139543 | 3/1973 | Germany | 341/31 |
| 8601954 | 3/1986 | WIPO | 341/31 |

OTHER PUBLICATIONS

H. Matino, "Optical Keyboard", IBM Tech. Discl. Bulletin, vol. 20, No. 2, Jul. 1977.

*Primary Examiner*—Thomas Mullen
*Attorney, Agent, or Firm*—William J. Burke

[57] ABSTRACT

A full N-key rollover capability information entry device includes first and second sets of intersecting light guides oriented at an angle to one another which may comprise a mesh of waveguides that together form a self-supporting planar sheet of a substantially transparent material at the wavelength of light introduced into one end of at least one of the first and second sets of light guides. This permits each intersection to comprise a common portion of both a light guide of the first set and a light guide of the second set that intersect at that intersection. Detection of changes in the intensity of the light in at least one of the sets of light guides in response to key actuation that blocks a portion of the light at a certain intersection is indicative of that actuated key.

2 Claims, 12 Drawing Sheets

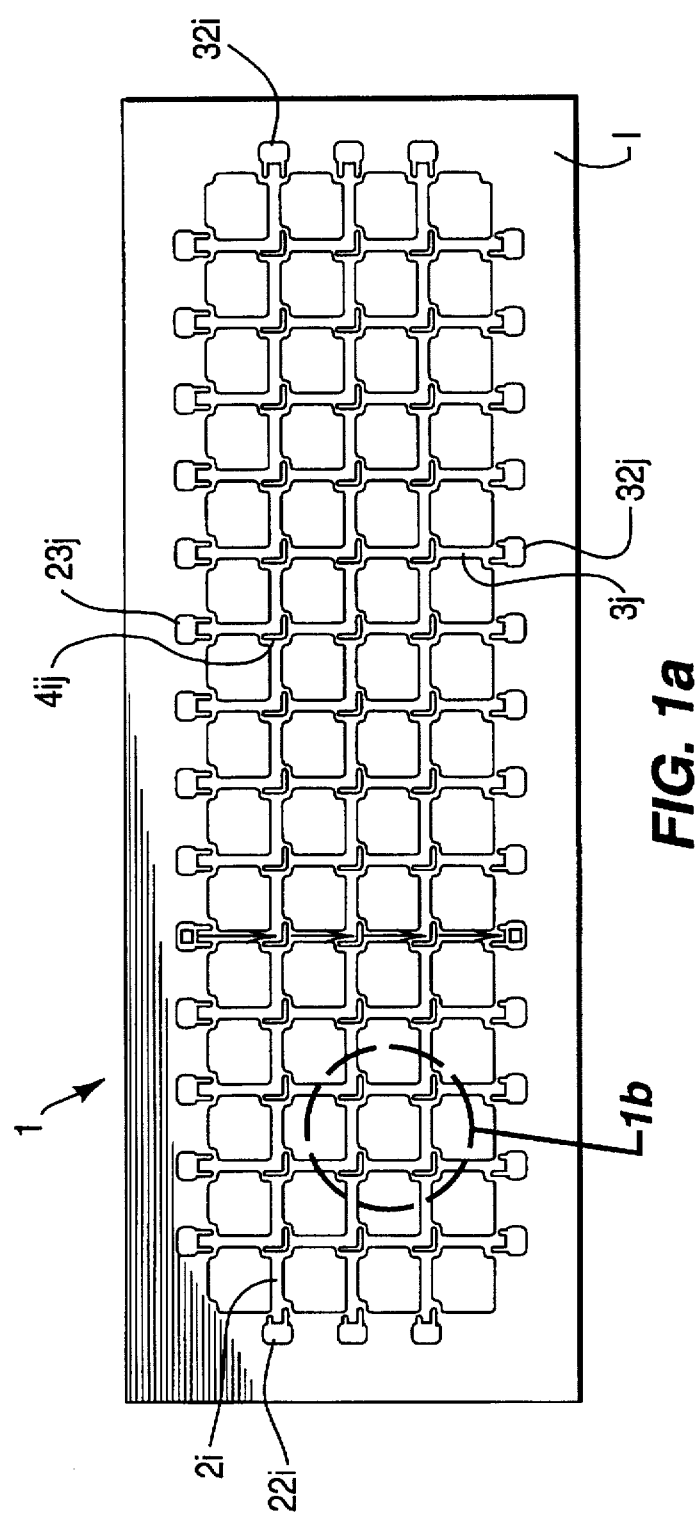
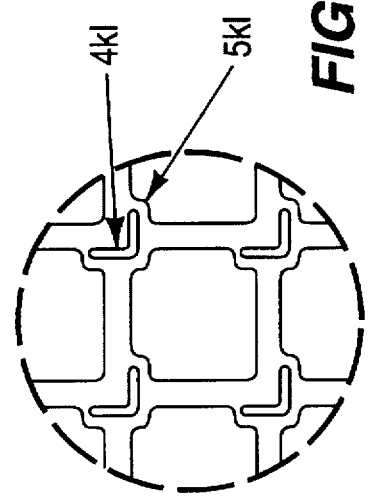
FIG. 1a
FIG. 1b

OPTOMECHANICAL INFORMATION ENTRY DEVICE

BACKGROUND OF THE INVENTION

Information entry devices, such as keyboards, keypads, and other devices, are the primary interface for user-input of information into devices such as typewriters, information processing/storage units, display systems, machinery and instrument control panels and must possess long-term, reliable tactile responsiveness. Such devices, which may contain more than a hundred keys, are typically electromechanical devices in which a key converts mechanical motion into an electrical signal by means of a switch or a transducer. Typically, an electromechanical keyboard requires a momentary electrical contact between two or more conductive elements which may be metal, plated dielectrics or conductive polymers. In each case, long-term stability of the contact resistance, the material conductance, wear, fatigue, creep, and change of compression modulus are important. Flat cable or flexible circuit conductors are used to connect the keyboard to the electronics on the master printed circuit board.

One electromechanical keyboard design consists of keys that deflect electrically passive cantilevered springs which come into physical contact with a formed molded elastomeric pad. The elastomeric pad has areas of conductive material that are molded into a shape that renders them readily deformed when they are pressed by the cantilever springs. These conductive areas are juxtaposed to conductive areas on an adjacent and coplanar printed flexible circuit. Circuit traces are normally electrically isolated by fine separations in the etched or printed circuit. The isolated traces become electrically connected when they are momentarily overlapped by the deformed conductive pad area when pressed by the key-operated cantilevered springs.

It would be desirable to have data entry devices having lighter weight and thinner profile than that of an electromechanical keyboard.

SUMMARY OF THE INVENTION

The invention is an optomechanical data entry device comprising first and second sets of intersecting light guides oriented at an angle to one another, first means for introducing light into one end of at least one of the first and second sets of light guides, means for changing the intensity of the light in at least one of the sets of light guides; and means for detecting the change in the light intensity.

BRIEF DESCRIPTION OF THE DRAWING

FIG. 1a is a schematic illustration of an optomechanical information entry device of the invention.

FIG. 1b is a detailed section view of the intersection of several rows and columns of the device shown in FIG. 1a.

FIG. 6b is a side view of the portion of the light guide matrix of FIG. 6a.

DETAILED DESCRIPTION

Figure 2A:
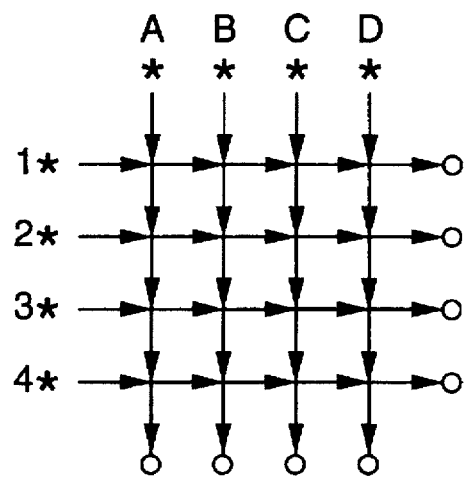
FIGS. 2a–2c, together, are a schematic illustration showing the problem detecting three simultaneous key strokes.

In FIG. 12 an optomechanical information entry device 1 comprises sets of light guides corresponding to rows 2 and columns 3, respectively, thereby forming a mesh of waveguides. Preferably the sets are made from a thin sheet of a material having good optical transmission at the emitter wavelength and sufficient strength that the sheet is self-supporting. Light is introduced into one end of each guide $2i$ and $3j$, respectively, of the sets of light guides 2 and 3 from a plurality of emitters $22i$ and $23j$, respectively. Each light guide has a gap $4ij$ at each row/column intersection. The light from an emitter normally travels through the light guide and jumps each gap $4ij$ until it reaches the opposite end where the light is detected at each light guide by a detector $32i$ and $32j$, respectively. A key cap and plunger is situated above the intersection of each row and column. When a key is depressed, an interrupter "flag", a protruding feature on the bottom of the key, is pushed downward into the slots beneath it. This causes the light beam of one row and one column to be blocked. Therefore, light does not strike the detectors at the end of those two paths and the decoding circuit can determine which key is depressed. The location and identity of the key is determined using electronic decoding circuitry to identify the particular guide in each set. One may minimize the number of light sources by using a technique of flooding numerous guides with light from one LED.

The intersection of several rows and columns are shown in more detail in the section view of FIG. 1b. The gap $4kl$ is centered in the intersection of the row and column with the surrounding bridge $5kl$ providing local structural integrity to device 1.

Since the index of refraction of air is less than the light guide material, the light will tend to continuously glance off the internal surface and travel down the guide as long as the angle of incidence is greater than the critical angle. Since the device structure cannot be suspended in most cases, one or more surfaces in contact with the guides will usually be a material other than air. These surfaces must be in contact with a material selected to have an index of refraction less than the index of the guide material, the guide must be coated to produce the same effect or the supporting contact area must be minimized. Only the low-index film between the guide sheet and the supporting substrate is necessary for optical reasons but a sandwich construction may be chosen for mechanical integrity.

On a typical keyboard design, key depression causes a closure of one or more switch contacts which is communicated, through a printed circuit board, to an integrated circuit (IC). The IC translates the signal into the binary code that is sent to the device served by the keyboard. A minimum of seven bits of binary code is required in order to uniquely represent each of up to 127 individual keys. This, however assumes that only one key is actuated at a time. A problem arises when more than a single key is held down at the same time. In this case, the decoding circuitry is not able to uniquely identify all of the active keys.

Figure 2B:
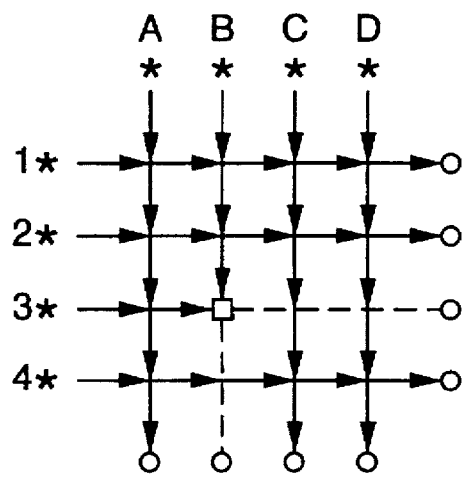
Figure 2C:
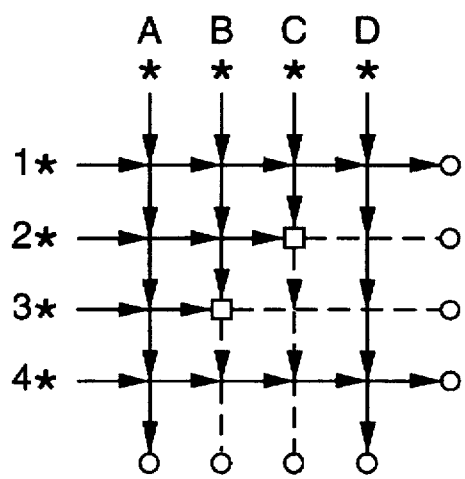

In an optomechanical keyboard, if two keys are depressed simultaneously, the logic of the decoding circuitry will still be able to determine which ones they are. However, if three or more keys are depressed simultaneously, the circuitry will not always be able to correctly determine which keys they are. This is demonstrated in FIG. 2 where the light sources are indicated by the asterisks and the detectors are indicated by the open circles. FIG. 2(a) shows a sample four by four light guide device where none of the light paths have been blocked (none of the keys have been depressed). FIG. 2(b) shows one pair of light guides blocked by the depression of a key. The row and column designation of this key is 3B. FIG. 2(c) shows two pairs of row and column guides blocked by the simultaneous depression of keys 3B and 2C. If key 2B or 3C is now depressed, the circuitry will not be able to detect them because the light has already been blocked from the detectors at the end of rows 2 and 3 and columns B and C. This, in its simplest form, is the rollover problem.

For practical purposes, most designs seek a middle ground that permits a certain number of keys to be depressed simultaneously: two, three, four, or more. The number also may not be constant throughout a single keyboard. Some keys may work in combination with three other keys, while others work together with only two other keys depending on the coding arrangement.

The greater the member of different keys that can be represented by the system (i.e. the number of unique switch closure combinations) compared with the actual number of keys to be represented by the system, the greater too is the number of keys that can be made to function simultaneously. The upper limit of this statement is, of course, when the decoding circuitry has as many inputs as there are keys. In that case, every single key can be depressed and the decoding circuitry will still be able to uniquely recognize it. This is referred to as "N-key rollover". It is a very desirable goal for manufacturers of devices using keyboards to input information. To have that many inputs to the decoding circuitry is impractical, however, in most cases.

Figure 3A:
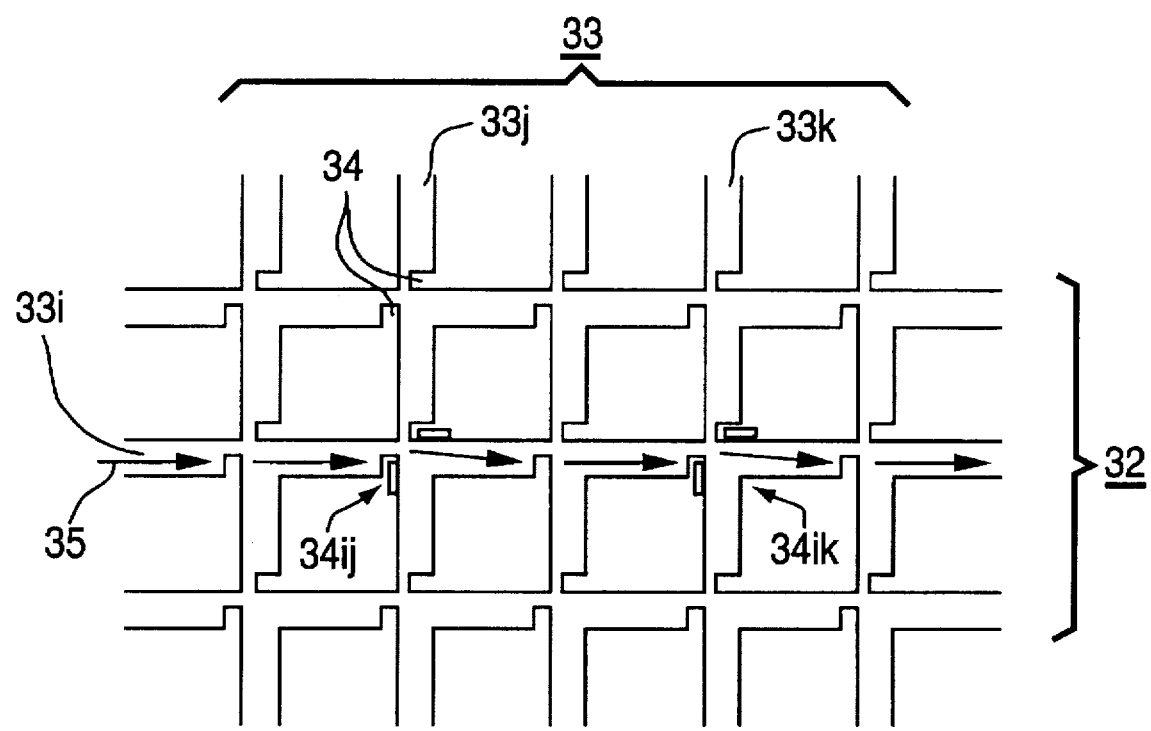
FIGS. 3a–3b, together, are a schematic illustration of an alternative embodiment of the invention.
Figure 3B:
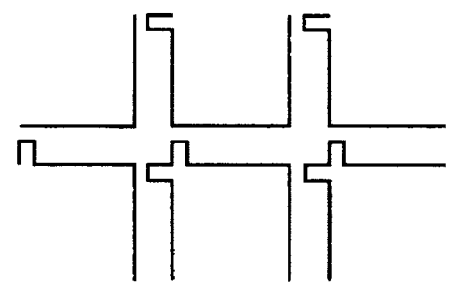

A section of an alternative light guide arrangement to obtain improved N-key rollover performance is shown in FIGS. 3(a)–3(b). In FIG. 3(a) the section has a plurality of rows 32 and columns 33. At the intersection of a row and column two partial slots 34 extend a distance into the guides from an edge thereof but do not cut completely across and through the guides to provide a gap in the path of the light beam propagating in each row and column. Intersections where the keys have been depressed are shown at 34ij and 34ik. When a key is depressed, two blades per key enter the partial slots at the intersections 34ij and 34ik and block a portion of the light beam 35 propagating along row 33i, thereby decreasing the transmission of the guide. This arrangement does not completely block the propagating beam when a single key is depressed so that subsequent keystrokes on the same row can be detected as a further decrease in the transmitted light. An alternative configuration for the slots 34 is shown in FIGS. 3(b).

Figures 4A, 4B, 4C:
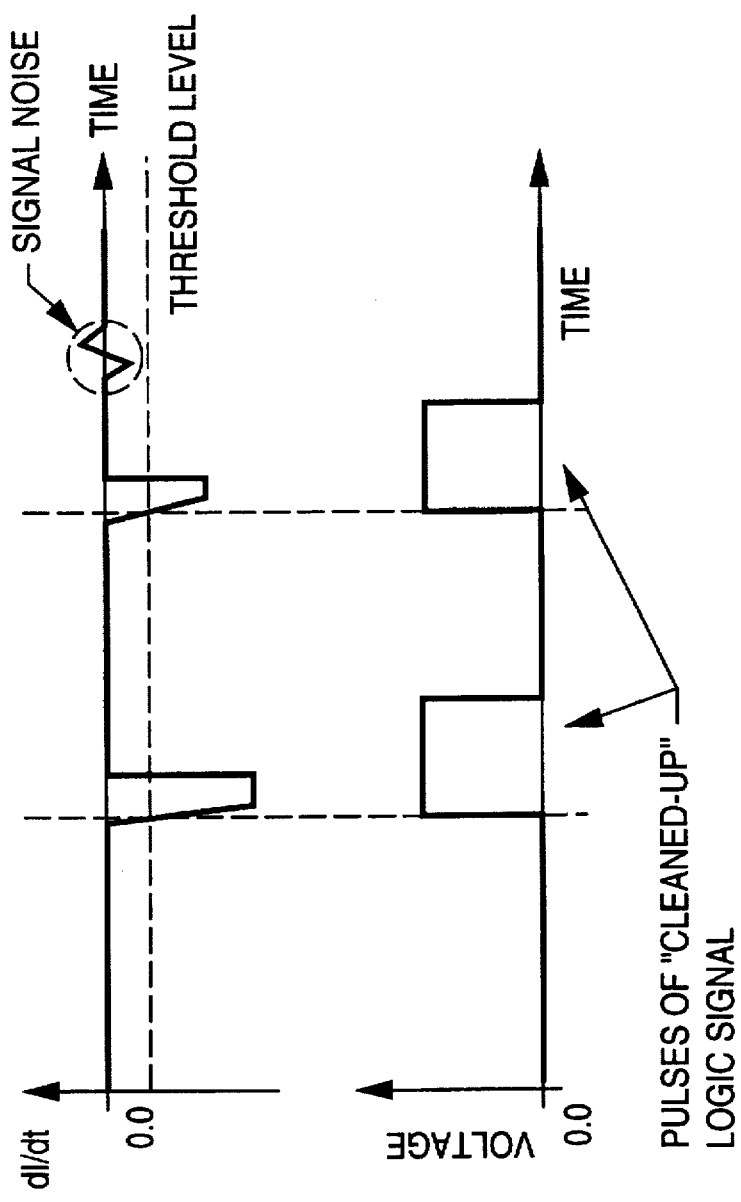
FIG. 4 is a schematic illustration of signals generated by the light detector and logic circuitry when a key is depressed.

The resulting output signal from the light detector is shown in FIG. 4(a). The first derivative of this signal is shown in FIG. 4(b) and can be "cleaned-up" as required using a simple logic circuit (i.e. one-shot, latch, etc.) producing the series of pulses shown in FIG. 4(c). After the first key has been depressed in any given row or column, the light throughput to the detector in that row or column is reduced but not eliminated. Subsequent keys depressed in that row (or column) will also be correctly identified since the effect of the subsequent keystrokes will also be to reduce but not eliminate the transmitted light. The rate of change of the light transmission is the determining factor. Thus, many keys can be depressed in very rapid succession using this scheme. As long as there is a short time difference (on the order of a millisecond or so) between the downward motion of one key compared with another, the detection circuit should be able to correctly identify each key. Therefore, the detection of the initial actuation of each key cannot occur exactly simultaneously and generally does not.

Whether "N-keys" (i.e. all of them) can be detected simultaneously, depends on whether the light throughput will decrease by some amount as each key in a given row is depressed. After depressing some (yet unknown) number of keys in this row, the level of the light throughput will become close in magnitude to the noise level. The closer these two levels become, the less reliably will the signal be interpreted; the rise time of the first derivative needs to be faster than some given minimum rate so that keys can be actuated in very rapid succession—"simultaneously" for all practical purposes. The rise time is mainly dependent on three factors: how fast the key is depressed, the amount of light being intercepted by the flag, and the characteristics of the electronic components.

After a key stroke has been detected, the logic of the system assumes that the key remains depressed until the key release (upward motion) signal is detected. The upward release motion of a key is detected in the same manner as depression; however, the resulting signal is of the opposite polarity.

The configuration of FIG. 12 has extra material, referred to as bridges, at the intersections which helps hold the entire light guide structure together as a single piece. The connection point of each bridge to the side of a given light guide is a location where significant light loss occurs. The partial slot design, as shown in FIGS. 3(a)–3(b), has no material in excess of the light guides themselves. The partial slot lets the entire structure hold together as a single piece without producing the same mount of light loss that the bridges cause.

Figure 5:
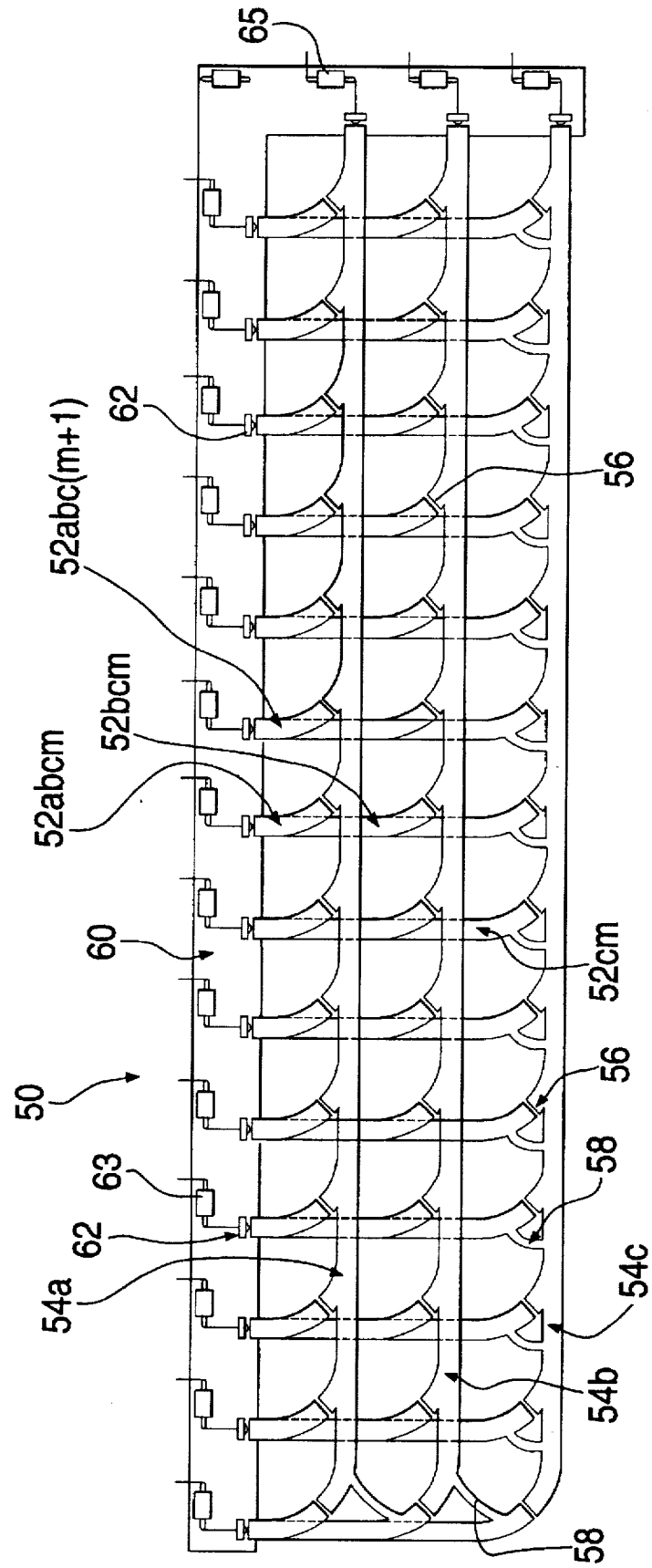
FIG. 5 is a schematic illustration of an alternative light guide matrix of the invention.
Figure 6A:
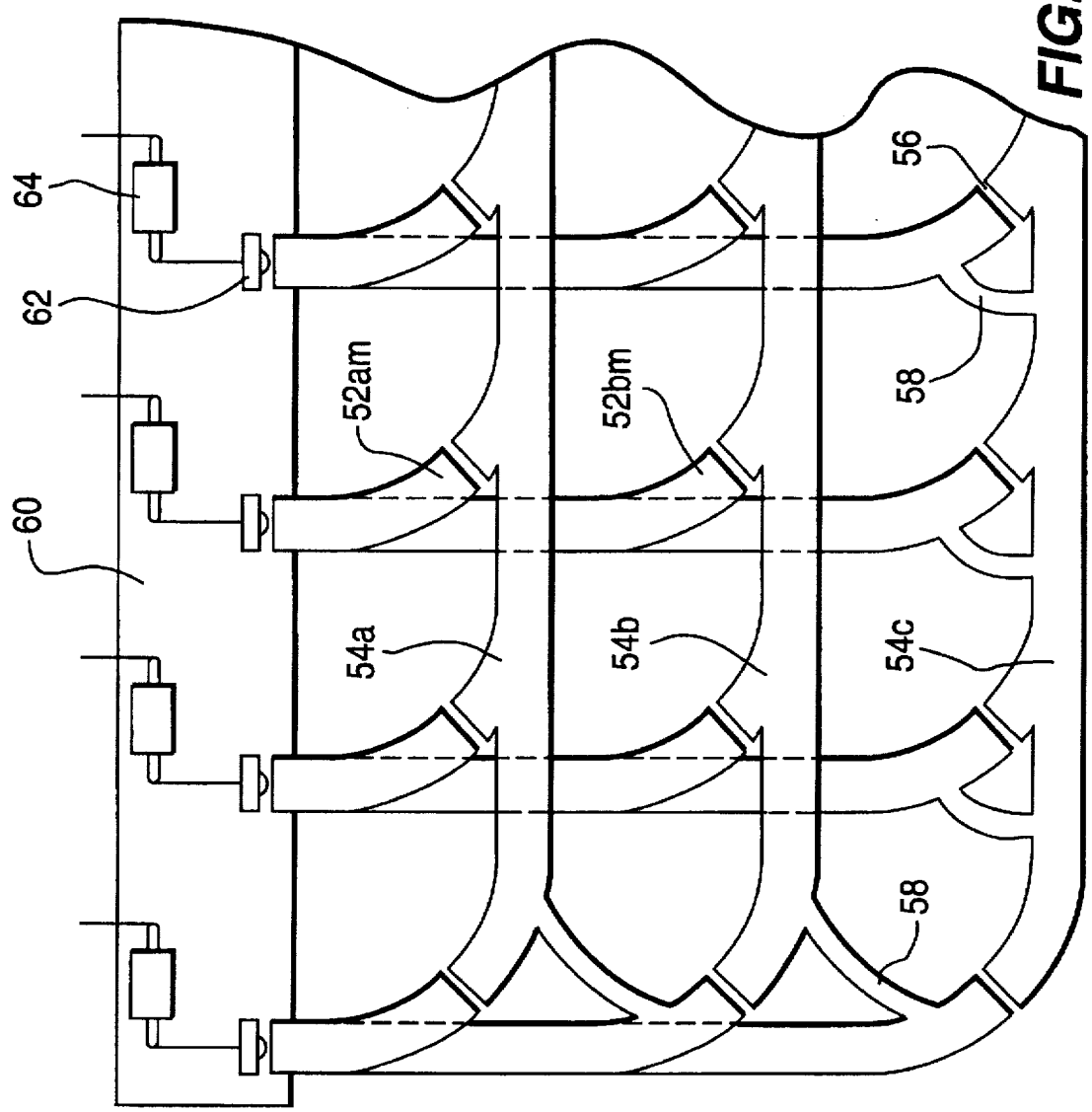
FIG. 6a is an enlarged view of a portion of the light guide matrix of FIG. 5.
Figure 6B:
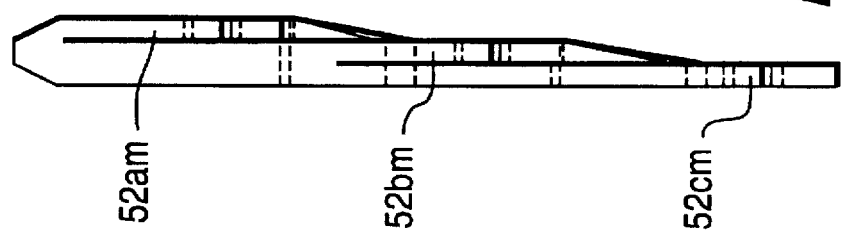

An alternative data entry device of the invention is shown in FIGS. 5 and 6 where the data entry device 50 comprises a plurality of light guides 52abcm, each of which splits into a subguide 52am and a guide 52bcm. Each subguide 52am has a curved portion extending into a second direction at an angle to its initial axis, preferably at right angles to its original axis, and is joined to the corresponding subguides of the adjacent light guides to form a continuous light guide 54a in the second direction. The guide 52bcm extends a further distance, at which point it splits into subguides 52bm and 53cm. Subguide 52bin has a curved portion extending into the second direction and is joined to the corresponding subguides of the adjacent light guides 52 to form a continuous light guide 54b in the second direction. Subguide 52cm has a curved portion extending into the second direction and is joined to the corresponding subguides of the adjacent light guides 52 to form a continuous light guide 54c in the second direction. The curved portion of each subguide 52xm has a gap 56 extending therethrough for an interrupter blade to enter when the corresponding key is depressed, thereby blocking light transmission through the particular subguide. In the absence of the blade, the spacing of the gap 56 is small enough that little of the propagating light beam is lost through reflection or refraction. The width of the gap 56 and the thickness of each subguide is about 0.76 millimeters (mm).

Each curved portion of the light guides adjacent an unsupported edge of the light guide array has a bridge 58 connecting the curved portion to the other side of the gap 56.

The ends of the guides are mounted to circuit board 60 on which are mounted the emitters 62 with associated drive circuitry 63, detectors 64 with associated bias and amplification circuitry 65. The emitters 62 are typically commercially available light emitting diodes such as a Motorola MLED71 infrared LED. Visible LED's and detectors can also be used. The detectors 64 are typically commercially available p-i-n photodiodes, such as Motorola MRD721 PIN photodiodes. Appropriate emitter drive circuitry 63 and detector bias and amplification circuitry 65 are well known in the art.

Emitters 62, located at the entry to guides 52m, are turned on sequentially strobing all the guides 52m. The light pulse that enters a given guide 52m can proceed through one of the three subguides 52xm. The geometry and size of each subguide 52xm ensures that approximately an equal portion of the original light beam enters each subguide 52xm. Light propagates along each subguide 52xm, crosses the gap 56, enters and propagates along light guide 54x until it impinges upon a detector 64. The light transmission loss at each gap due to reflection, scattering etc is about two to three dB.

At each instant of time, the electrical circuitry knows at which column the LED transmitter is being pulsed. Therefore, if the detector of a given row does not receive a light pulse at that same instant, the circuitry can determine the column and row of the key that has been depressed. This time division multiplexing occurs at a high enough frequency that key depressions will not be missed, even in the case of a very fast operator.

Figure 7A:
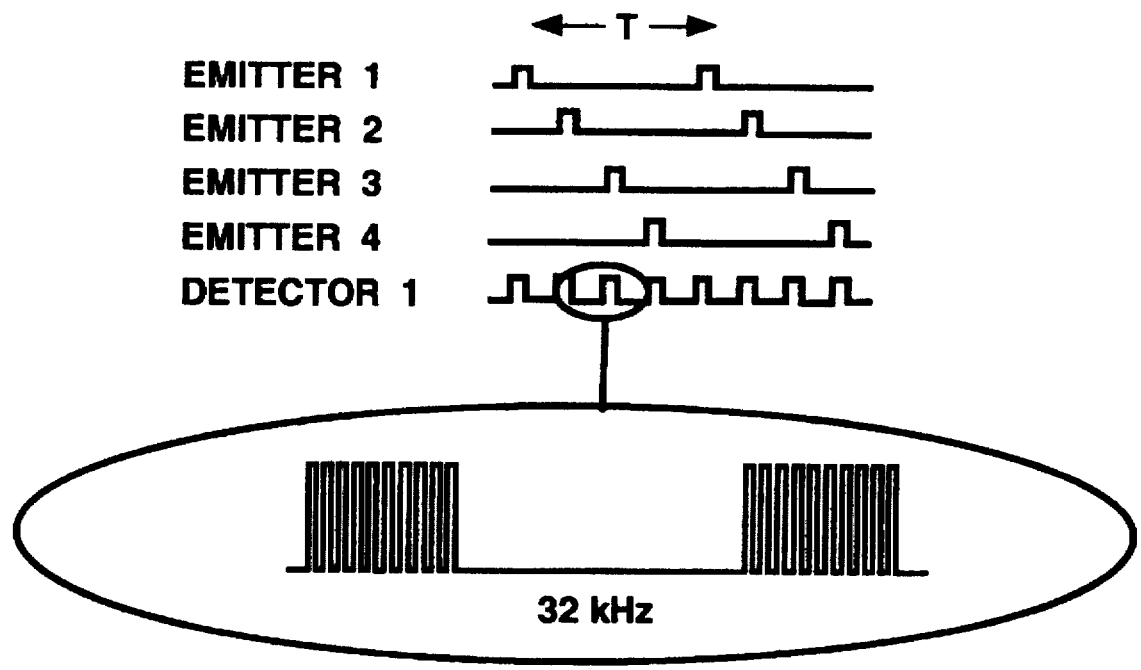
FIGS. 7a–7b, together, are a timing diagram for the operation of the matrix of FIG. 5.
Figure 7B:
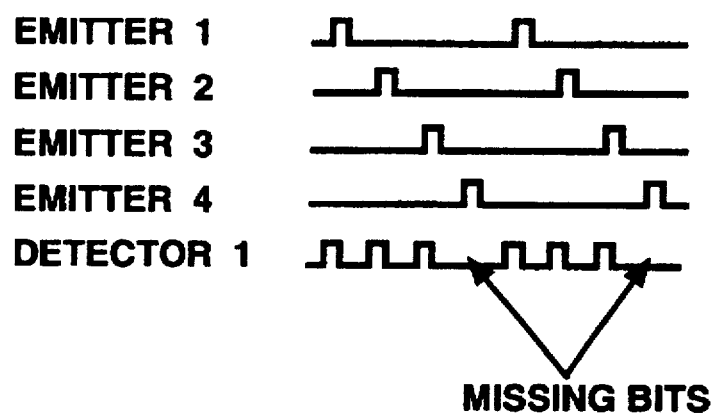

In FIG. 7(a) a timing diagram for the operation of the device of FIG. 5 is shown. For the sake of simplicity, only four emitters and one detector are shown to illustrate the principles involved. The emitters are pulsed sequentially in a period T. The detector 64 for a particular row detects the stream of pulses to each emitter so long as no key is depressed. In FIG. 7(b) the effect of depression of key 4 is illustrated. The pulses emitted by emitter 4 are not detected by detector for the particular row as marked by the arrows. The detectors 64 are preferably always on.

The pulse to each emitter is typically a burst of square waves at 32 kHz or greater. The rate at which the emitters are pulsed is dictated by the need to ensure that at least one scan occurs when a key is "down" for the fastest operator. For example, for a typical alphanumeric keyboard having fourteen keys across, a scan or strobe rate of 80 pulses per second to each emitter for a total of 1120 pulses per second from the fourteen emitters is sufficient. The frequency of the square wave is preferably at least twenty times the total number of pulses per second. A similar calculation can be made for other optomechanical devices incorporating the invention.

The use of time base modulation (TBM) eliminates the need for an emitter and a detector for each row and column as required by the embodiment of FIG. 12. One emitter per column and one detector per row fully defines the identity of an interrupting key. The resulting light guide of FIG. 5 is expected to impose smaller transmission losses due to the fact that the number of gaps and bridges per light path is reduced from fourteen per row and three per column to one gap per row/column combination. Estimates based on molded light guides suggest that the elimination of gaps and bridges will outweigh the additional bends and produce a transmission efficiency improvement of 33%.

The optomechanical device of FIG. 5 differs from its electrical counterpart in that the light emitting and receiving devices must be ready at all times to detect one or more key strokes. This requirement raises questions of power consumption which the optomechanical devices of the invention address. First, the LEDs are time base modulated so that only one LED is emitting at any time. Secondly, the input pulse to an LED is itself modulated at higher frequency to extend life and save energy. The detectors are multiplexed among the array of LEDs for the particular subguide 52xm. Furthermore, the reduction in the number of gaps and bridges in each subguide 52xm requires less light output from the LEDs. For energy sensitive systems such as battery operated laptop computers, a sleep mode of operation can also be added.

Figure 8:
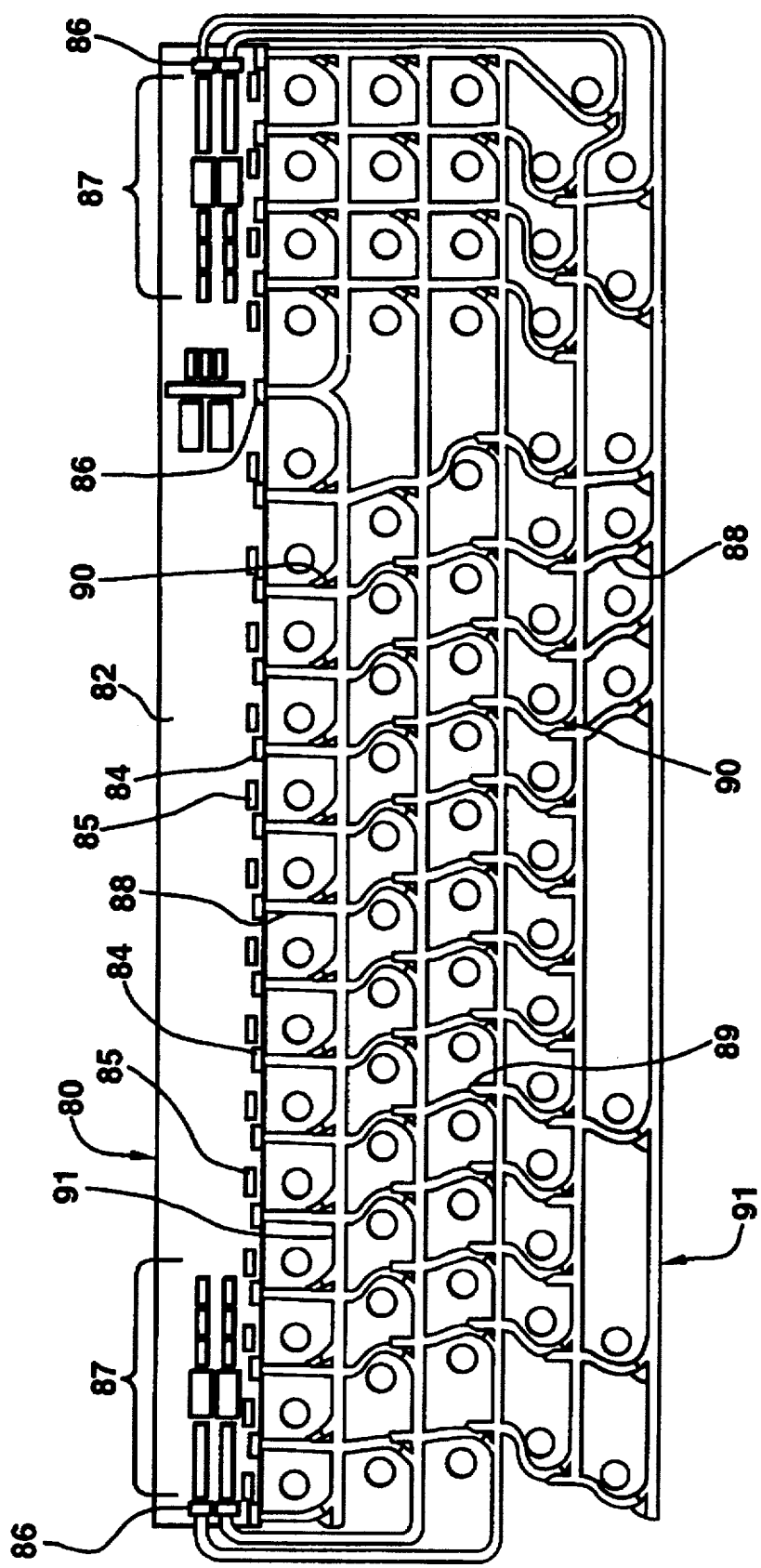
FIG. 8 shows a layout for the light guide of FIG. 5.

FIG. 8 is an illustration of a layout 80 of the data entry device of FIG. 5 in a standard keyboard format and includes the replacement of the "L" shaped circuit board, shown in FIG. 5, with a rectangular shape circuit board 82. The overall light guide and circuit board assembly is smaller than the design of FIG. 5. Thus, the over-all size of a keyboard using the layout 80 can be narrower which is an important consideration for devices such as laptop and notebook computers.

In FIG. 8 both the emitters 84, emitter drive circuitry 85, detectors 86 and detector circuitry 87 are located on the printed circuit board at the top of the keyboard. Light is conducted vertically by the light guide 88 from an emitter 84 to a divider 89 which splits off some of the light and directs it to a switch gap 90 that can be interrupted by a key stroke. Since the gap 90 is off the main circuit, no key rollover problems exist. The light is recombined in a horizontal guide 91 and transmitted to a detector 86. The vertical guides are shaped to skirt the key with an adequate radius to limit light loss.

Figure 9:
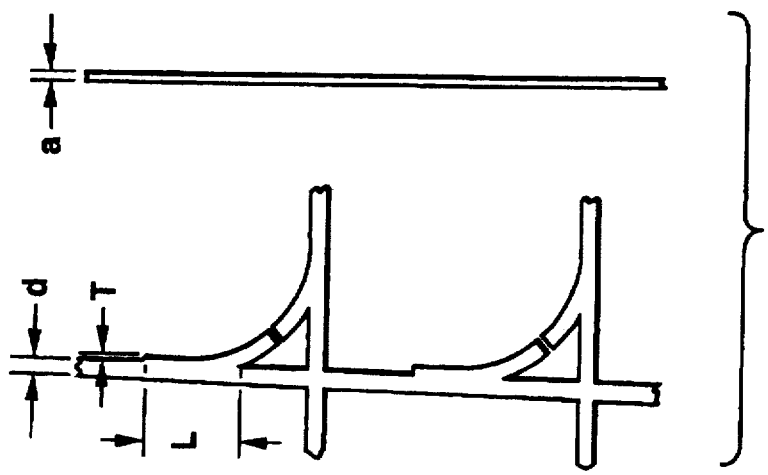

In FIG. 9 a planar configuration for the waveguides, as opposed to the multilayer configuration, is shown in top and cross-sectional views. The dimensions of this light guide are typically d=1.5 mm, T=0.25 mm, L=7.6 mm and a=0.75 to 1.5 mm.

Figure 10:
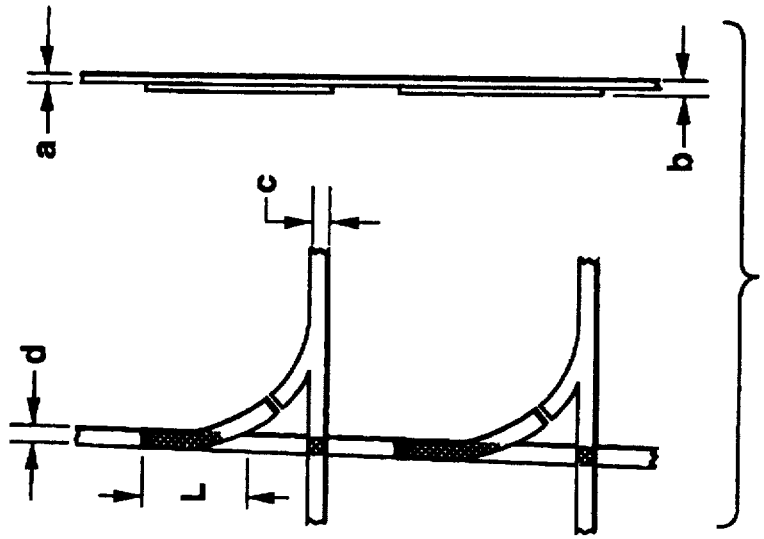

In FIG. 10 an alternative multilayer configuration for the waveguides is shown in top and cross-sectional views. The dimensions of this light guide are typically d=1.5 mm, T=0.25 nm, L=7.6 mm, a=0.75 to 1.5 mm and b is twice a.

Figure 11:
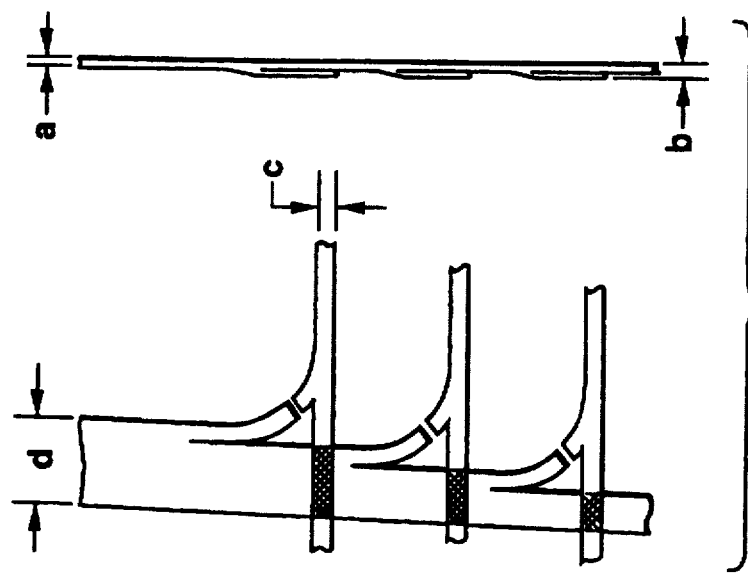
FIGS. 9–11 are planar and cross sectional views of different embodiments of the light guide matrix of FIG. 5.

In FIG. 11 an alternative multilayer configuration for the waveguides is shown in top and cross-sectional views. The dimensions of this light guide are typically d=n times 1.5 mm where n is the number of times the guide is divided into subguides. T=0.25 mm, L=7.6 mm, a=0.75 to 1.5 mm, b is twice a and c=1.5 mm.

While the gap is shown extending through the light guides in each of the embodiments of the invention, it is clear that this is not necessary. It is sufficient that the gap extend a distance into the light guides such that there is a measurable change in intensity when a key stroke occurs. It is also clear that the key stroke or other action resulting in a change in the intensity of the transmitted light can be the removal of an interrupter from the gap as well as the insertion of the interrupter.

One of the most attractive advantages of the optical keyboard is its non-contact operation which allows the "touch" to be optimized independently of the switching function. The optical makepoint can be set to occur at a point of the key travel that is ergonomically favorable. However, this advantage is not realized if the optical makepoint cannot be made to occur within a reasonable tolerance of key travel. The makepoint tolerance is dictated by optical, mechanical and electrical considerations. As a key is depressed, a blade-type interruptor that is part of the key moves into the gap of the light guide. As the blade intercepts more of the cross-section of the light guide, the light reaching the photodetector diminishes. Since the light losses of each of the circuit paths are not equal and considering the tolerance of the interrupters, the point at which the light level reaches the threshold of the detector circuit differs and a tolerance exists as to the location of the makepoint for each key travel.

Additional ambiguity is injected when an automatic gain control (AGC) circuit is used with a detector to compensate for varying light losses. As the light diminishes due to key interruption, the AGC causes unwanted compensation, which results in the makepoint moving away from the nominal and occurring later in the key travel. This phenomena can also permit a flutter effect when teasing the key. Bistable mechanical systems have been used to decouple the key motion from the operator to improve this condition. The operator cannot depress the key to the makepoint manually. At a defined point in the travel that precedes the makepoint, the toggle effect of the bistable mechanism takes over control of the key. The characteristics of the motion of the key when controlled by the bistable mechanism can be designed to be much more consistent than the finger control. The tolerance of the toggle point of the bistable mechanism, be it produced by a molded rubber mat, a buckled column spring or some other mechanism must be adequate to maintain a consistent travel distance between the mechanical toggle point and the optical makepoint.

Light guides can be injection molded as long as cross sections are large enough to allow for proper fill. For smaller cross sections thermal compression molding techniques may be used. In either case, it would be advantageous to produce the light guides with an outer coating of a material of lower refractive index than the light guide itself. This is particularly true for those locations where the light guide will be in intimate contact with materials having a higher refractive index. A variety of approaches to form the light guides are depicted in FIGS. 12–14.

Figure 12A:
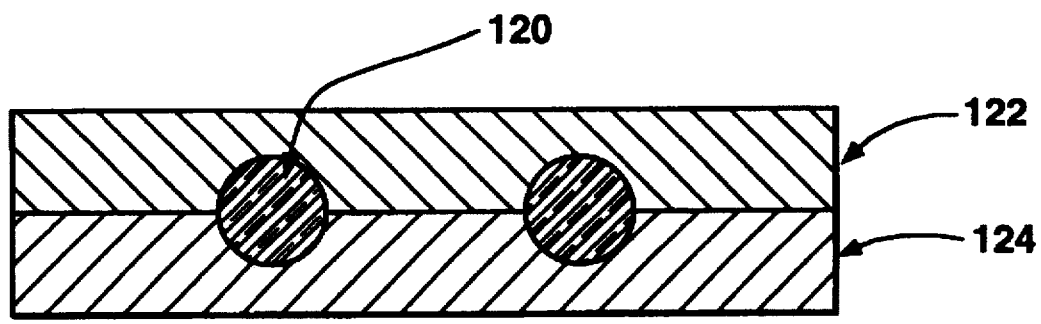
FIGS. 12a–14b, together, show three different processes for forming the light guide matrices of the invention.
Figure 12B:
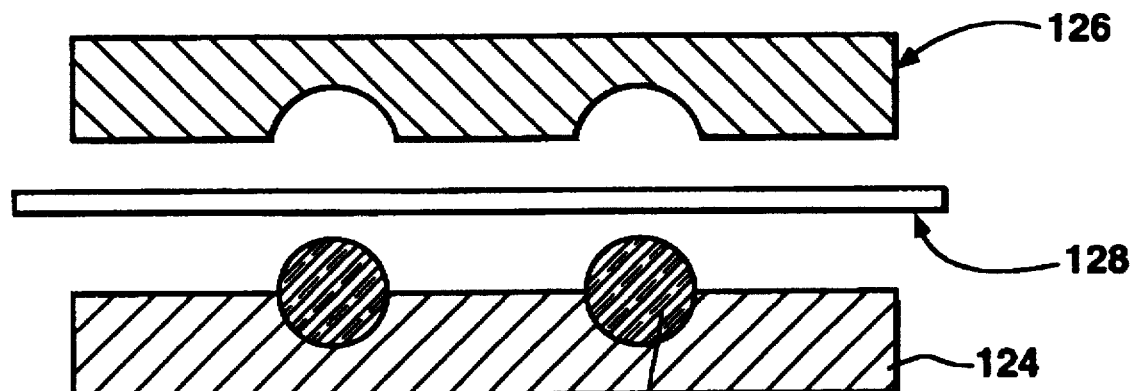
Figure 12C:
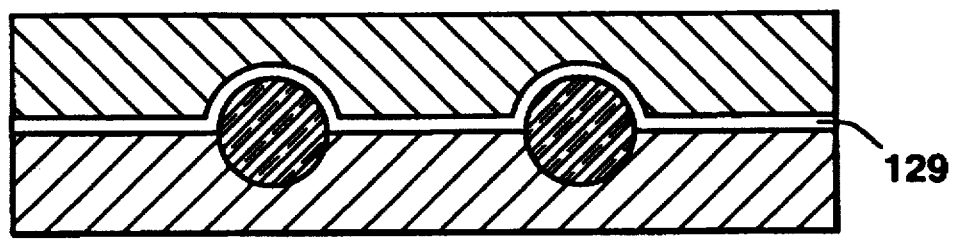

In FIG. 12 a process for forming the light guide is shown. In FIG. 12(a) the light guide core 120 is molded between the mold halves 122 and 124. In FIG. 12(b) the mold half 122 is replaced by the mold half 126. A thin sheet of second material 128 is positioned between the halves 124 and 126. In FIG. 12(c) the mold closes with thin sheet of second material 128 in the position shown to form the guide 129 composed of materials 120 and 128.

Figure 13A:
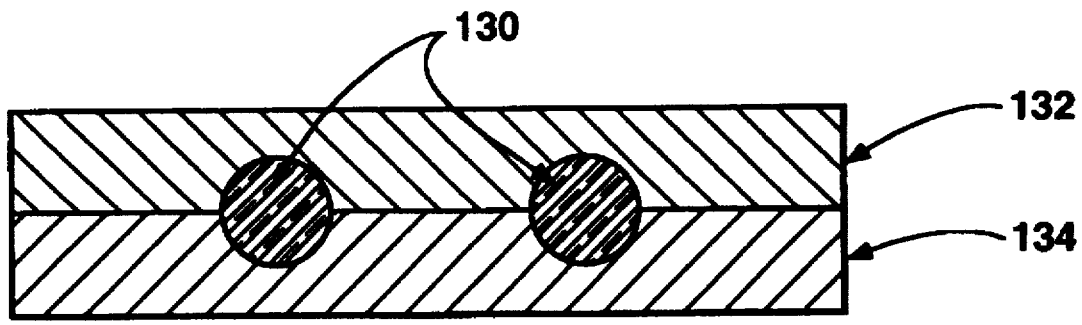
Figure 13B:
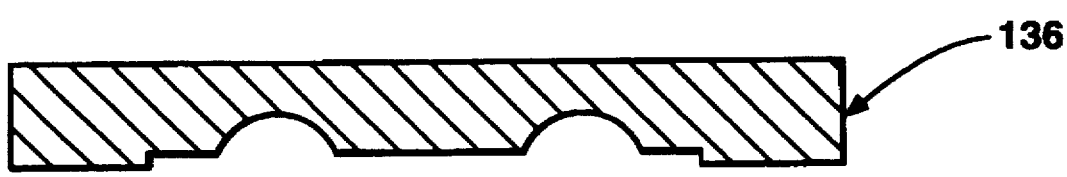
Figure 13C:
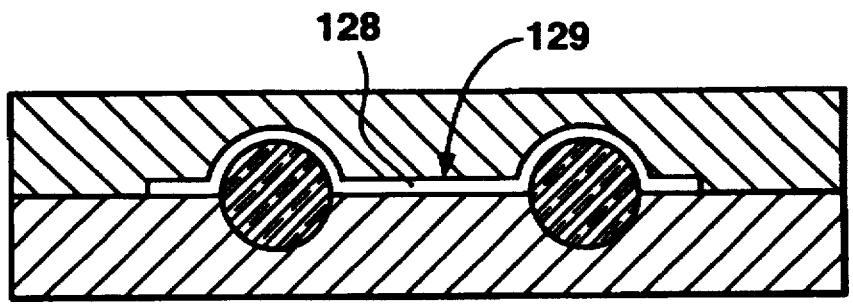

In FIG. 13 an alternative process for forming the light guide is shown. In FIG. 13(a) the light guide core 130 is molded the between mold halves 132 and 134. In FIG. 13(b) the mold half 132 is replaced by the mold half 136. In FIG. 12(c) the mold closes and a second material 138 is injected into the mold to form the guide 139.

Figure 14A:
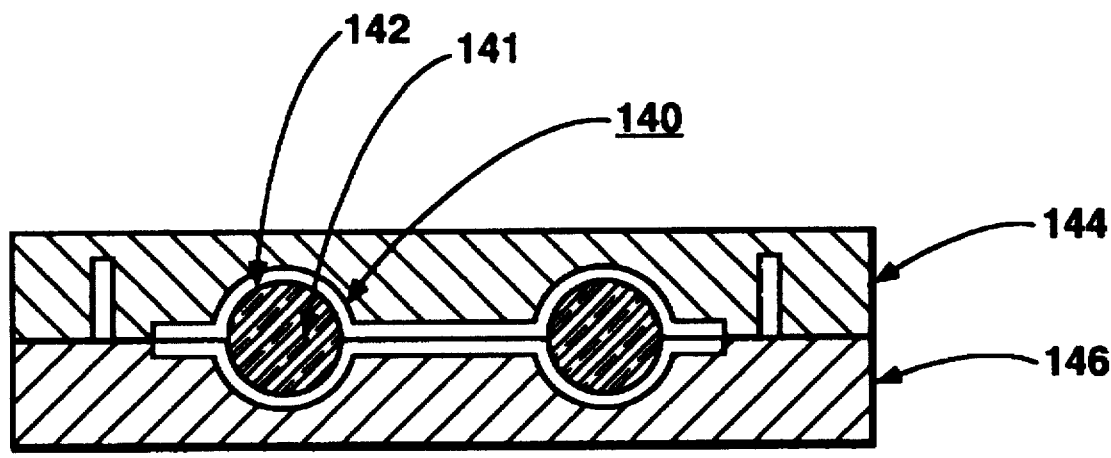
Figure 14B:
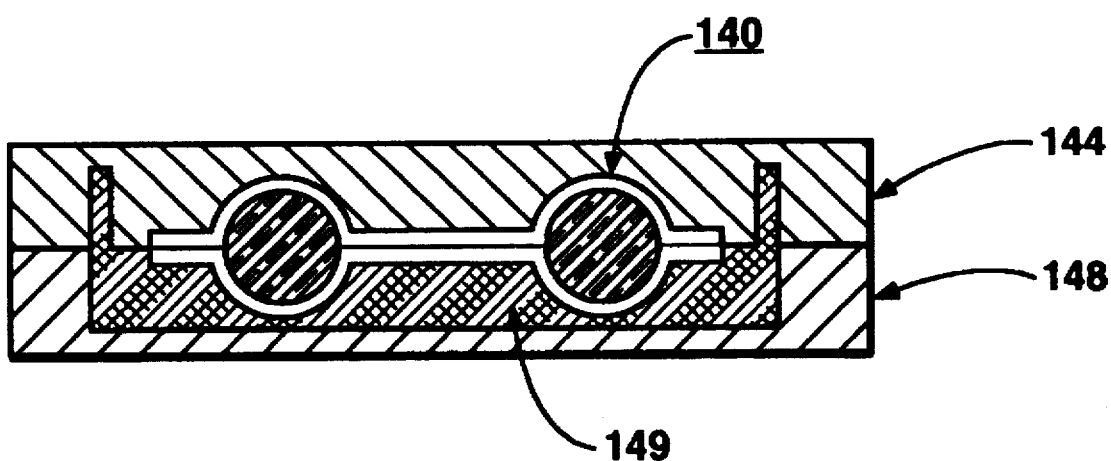

In FIG. 14 an alternative process for forming the light guide is shown. In FIG. 14(a) the light guide 140 comprising a core 141 and cladding 142 is formed between mold halves 144 and 146 as described in reference to FIGS. 12 or 13. In FIG. 14(b) the mold half 146 is replaced by the mold half 148 and the case material is injected. The light guide and case thus become one sturdy, integral piece.

In compression molding approaches, prelaminated stock with an inner core of higher refractive index, and outer layers of lower refractive index could be used as blanks for the compression molding process. As an alternative the three layers could be introduced into the mold as separate pieces that would be combined during molding.

In some applications where a flexible structure is desirable, the use of a thin guide is important. For the keyboard application, the area available for the light guide structure is planar and does not require exceptionally flexible or thin guides except for minimizing material cost. Therefore, the problem of introducing light into a thin guide from an emitter of greater diameter can be managed by compromising the material thickness. However, other schemes for introducing the light, such as from below rather than from the end, are possible. For the thinnest light guide, the embodiment shown in FIG. 7, which can be about 0.75 millimeters thick, is preferred.

A suitable material for the light guides is acrylic which can be readily cast using a variety of well known techniques or an optically clear silicone compound. Polycarbonate is preferred for the light guide in many applications for flame retardancy properties. In some cases, it may be desirable to use a process other than injection molding to produce the light guide. It should be possible to produce light guide patterns by silk screening or vector scanning processes which may be more economical for high-volume production and more flexible for short-run production.

The light received by the detector at the end of a light guide will usually also contain noise arising from stray light scattered out of other light guides. A method of dealing with signal-to-noise problems is to code each emitted signal so that the detected signal at each channel can be filtered from the noise signals. Still another approach is to use separate overlaid patterned sheets, one for each axis, to isolate the signals propagating in the rows and columns of the device from one another.

It is to be understood that the apparatus and method of operation taught herein are illustrative of the invention. Modifications may readily be devised by those skilled in the art without departing from the spirit or scope of the invention. For example, the invention is not limited to particular layouts of the light guides, the emitters and detectors or to particular timing rules or multiplexing arrangements. The invention is illustrated, for example in FIG. 5, in terms of an emitter for each column and a detector for each row. One of ordinary skill in the art will recognize that the converse arrangement of one emitter per row and one detector per column can also be used. It is also clear that lasers as well as LEDs and detectors other than PIN photodiodes can be used. It is also clear that the word optical is intended to include electromagnetic radiation of any wavelength which can be coupled into and propagate in the light guides. It is also clear that the two sets of guides can be physically separated from one another.

I claim:

1. In an optomechanical data entry device including first and second sets of intersecting light guides oriented at an angle to one another, first means for introducing light into one end of at least a certain one of the first and second sets of light guides, means for changing the intensity of the light in at least one of the sets of light guides, and means for detecting the change in the light intensity; the improvement wherein said data entry device comprises:

a self-supporting planar sheet of a transparent material at the wavelength of said introduced light that defines a mesh of waveguides that form said first and second sets of intersecting light guides, wherein each intersection comprises a common portion of a light guide of the first set and a light guide of the second set that intersect at that intersection.

2. The device of claim 1 wherein the first and second sets of light guides are oriented at right angles to one another.

* * * * *